United States Patent [19]

Hauden et al.

[11] Patent Number: 4,719,384
[45] Date of Patent: Jan. 12, 1988

[54] MINIATURE THERMOSTATTED OSCILLATOR

[75] Inventors: Daniel B. Hauden; Gilles D. Marianneau, both of Besancon, France

[73] Assignee: Centre National de la Recherche Scientifique, Paris, France

[21] Appl. No.: 909,970

[22] Filed: Sep. 22, 1986

[30] Foreign Application Priority Data

Sep. 24, 1985 [FR] France ............... 85.14141

[51] Int. Cl.⁴ .............................. H01L 41/08
[52] U.S. Cl. .................... 310/343; 310/346; 310/348; 310/344; 219/210; 361/401
[58] Field of Search ............... 310/341–344, 310/346, 348; 219/210; 361/286, 288, 401

[56] References Cited

U.S. PATENT DOCUMENTS

| 2,278,093 | 3/1942 | Peterson et al. | 310/346 X |
| 3,071,736 | 1/1963 | Vonbun et al. | 310/341 X |
| 3,796,968 | 3/1974 | Luscher | 310/344 X |
| 3,887,785 | 6/1975 | Ahlport | 219/210 X |
| 3,969,640 | 7/1976 | Staudte | 310/344 X |
| 4,216,371 | 8/1980 | Marotel | 219/210 X |
| 4,219,756 | 8/1980 | Nishida et al. | 310/344 X |
| 4,317,985 | 3/1982 | Wilson | 219/210 |
| 4,356,379 | 10/1982 | Graeme | 219/210 X |
| 4,420,652 | 12/1983 | Ikeno | 310/348 X |
| 4,464,599 | 8/1984 | Briese | 310/348 |
| 4,611,182 | 9/1986 | Chauvin | 310/343 X |
| 4,622,621 | 11/1986 | Barre | 361/401 X |

FOREIGN PATENT DOCUMENTS

| 461767 | 11/1973 | Australia . |
| 2239048 | 2/1975 | France . |
| 52-89090 | 7/1977 | Japan . |
| 55-27743 | 2/1980 | Japan . |
| 59-149406 | 8/1984 | Japan . |
| 1435665 | 5/1976 | United Kingdom | 310/343 |

Primary Examiner—Mark O. Budd
Attorney, Agent, or Firm—Poms, Smith, Lande & Rose

[57] ABSTRACT

This invention relates to a thermostatted oscillator comprising an assembly support constituted by a printed circuit provided with an opening, on the edge of which is fixed, at a reduced number of points, an electrically insulating secondary support on which are fixed, on the one hand, a piezo-electric resonator and, on the other hand, a prediffused circuit comprising in integrated form the essential elements of the electronic circuits for regulating the supply voltage of the assembly, of the electronic circuits for maintaining and amplifying the oscillations of the resonator, and of the electronic circuits for regulating the temperature of the resonator. The invention is more particularly applicable to miniature oscillators of high stability and low consumption.

13 Claims, 6 Drawing Figures

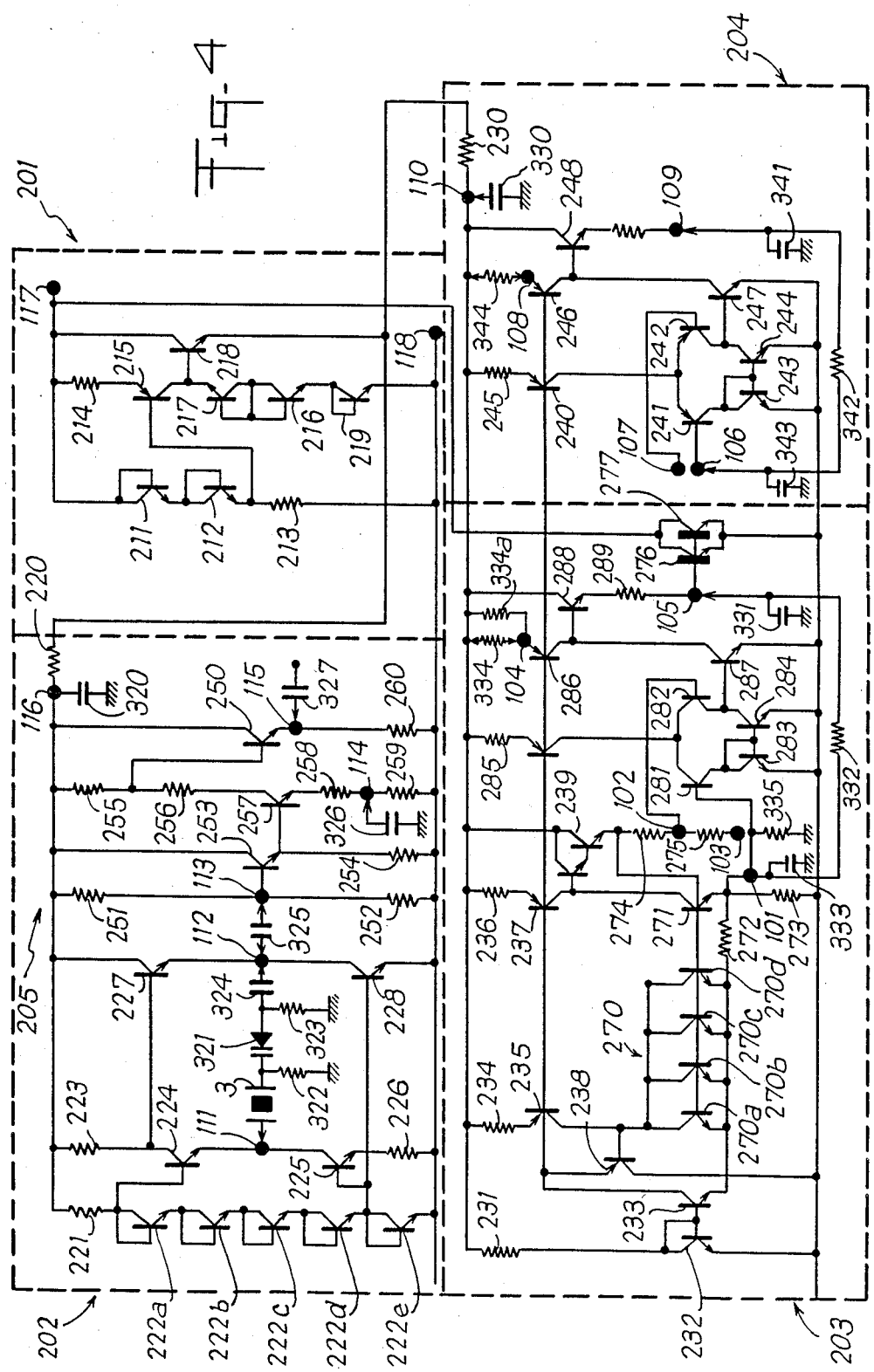

MINIATURE THERMOSTATTED OSCILLATOR

The present invention relates to a miniature thermostatted oscillator, comprising an assembly support, a piezo-electric resonator, electronic circuits for regulating the supply voltage of the oscillator, electronic circuits for maintaining and amplifying the oscillations of the resonator, and means for regulating the temperature of the piezo-electric resonator.

Various types of oscillators are known, made from piezo-electric resonators, such as quartz resonators and adapted to constitute in particular frequency reference elements of high precision and high stability. Such oscillators are generally placed in thermostatted chambers in order to limit the variations in temperature to which the resonator is subjected and thus to avoid fluctuations or drifts of the output signal of the oscillator. In this way, reliable, high-quality devices may be produced. However, the weight and dimensions due to all the circuits of the oscillator and especially to the thermostat are not negligible and it is difficult to produce piezo-electric crystal oscillators which are both of small dimensions and of good quality, although it is possible to have miniaturized resonators available.

In particular, one drawback of the devices of the prior art resides in the fact that the temperature sensor and the heating elements of the thermostat are relatively remote from one another, with the result that a considerable temperature gradient is produced which reduces the efficiency of the thermostat or involves a relatively high energy consumption which prevents the dimensions of the device from being substantially reduced.

It is an object of the present invention to overcome the drawbacks set forth hereinabove and to produce an oscillator which, whilst being of small dimensions, presents high stability and low consumption.

These objects are attained thanks to a miniature thermostatted oscillator, characterized in that the assembly support comprises a printed circuit provided with an opening on the edge of which is fixed, at a reduced number of points, an electrically insulating secondary support on which are fixed, on the one hand, the piezo-electric resonator and, on the other hand, an integrated circuit comprising in integrated form the essential elements of the electronic circuits for regulating the supply voltage of the oscillator, of the electronic circuits for maintaining and amplifying the oscillations of the resonator, and of the means for regulating the temperature of the piezo-electric resonator.

With this arrangement, there is a minimum of heat exchanges between the printed circuit and the secondary support, and the fact that the essential elements of the means for regulating the temperature of the resonator are integrated in a circuit disposed in the immediate vicinity of the resonator, reduces the temperature gradients and consequently allows an efficient regulation with a better yield which allows the electronic circuits to be presented in a miniaturized integrated form. Furthermore, the heat losses in the electronic circuits for regulating the supply voltage of the oscillator and the electronic circuits for maintaining and amplifying the oscillations of the resonator essentially occur within the integrated circuit and consequently participate in the heating of the resonator, which reduces the energy losses, whilst being taken into account by the temperature regulating means which are also integrated in the prediffused circuit, this guaranteeing a good yield and a high precision in the regulation. The integrated circuit is advantageously constituted by a prediffused circuit.

According to a first embodiment of the invention, the secondary support is constituted by a wafer made of an electrically insulating and heat-conducting material, such as beryllium oxide, which bears on one of its principal faces the piezo-electric resonator and on the other principal face the integrated circuit.

The integrated circuit and the package of the resonator are located opposite each other on either side of the secondary support wafer and are fixed thereon with the aid of an adhesive ensuring good thermal contact.

More particularly, the secondary support wafer comprises on its face bearing the integrated circuit parts metallized by screen process printing forming contact terminals and connected, on the one hand, to the integrated circuit by first connecting wires and, on the other hand, to the printed circuit by second connecting wires made of a poor heat-conducting material.

According to another embodiment of the invention, the secondary support is directly constituted by the package of the piezo-electric resonator, to which is added and fixed the integrated circuit, and which rests at a small number of points on the edge of the opening made in the printed circuit.

The oscilator may comprise a sealed package provided with a plurality of output terminals, inside which are disposed both the integrated circuit and the resonator, said package resting on the edge of the opening of the printed circuit and being electrically connected thereto by its output terminals.

The oscillator preferably further comprises means for controlling the frequency of the oscillator, constituted by discrete components added to the secondary support.

According to a particularly advantageous feature of the present invention, the means for regulating the temperature of the resonator comprise an internal thermostat comprising a temperature sensor, a comparator circuit and heating transistors integrated on the integrated circuit.

The internal thermostat may in addition comprise a resistor for adjusting the internal reference temperature and a resistor for adjusting the current in the heating transistors, which are constituted by discrete components placed on the printed circuit.

The internal thermostat may also comprise a negative feedback circuit constituted by discrete components placed on the printed circuit.

According to another advantageous feature of the invention, the means for regulating the temperature of the resonator further comprise a differential amplifier forming comparator integrated on the integrated circuit and cooperating with a temperature sensor and heating transistors constituted by discrete components placed on the printed circuit to form an external thermostat for rapidly heating the oscillator.

The miniature thermostatted oscillator according to the invention may further comprise a sealed package provided with output terminals inside which is placed the assembly support comprising the printed circuit and said secondary support, and in which a vacuum may be created.

The invention will be more readily understood on reading the following description with reference to the accompanying drawings, in which:

FIG. 4 shows the diagram of an embodiment of electronic circuits adapted to be used in a thermostatted oscillator according to the invention.

Figure 1:
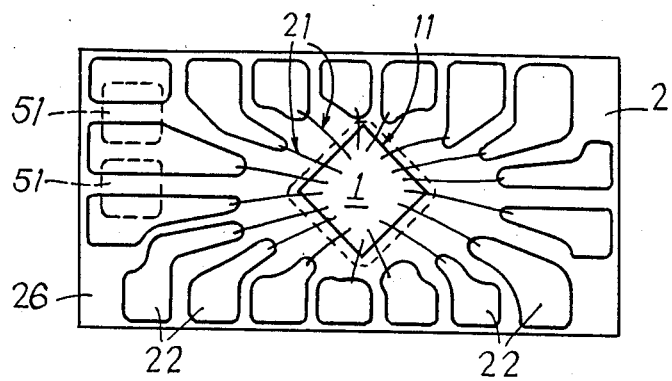
FIG. 1 is a plan view of an intermediate support receiving a prediffused circuit and a miniature piezo-electric resonator and adapted to be incorporated in an oscillator according to the invention.
Figure 2:
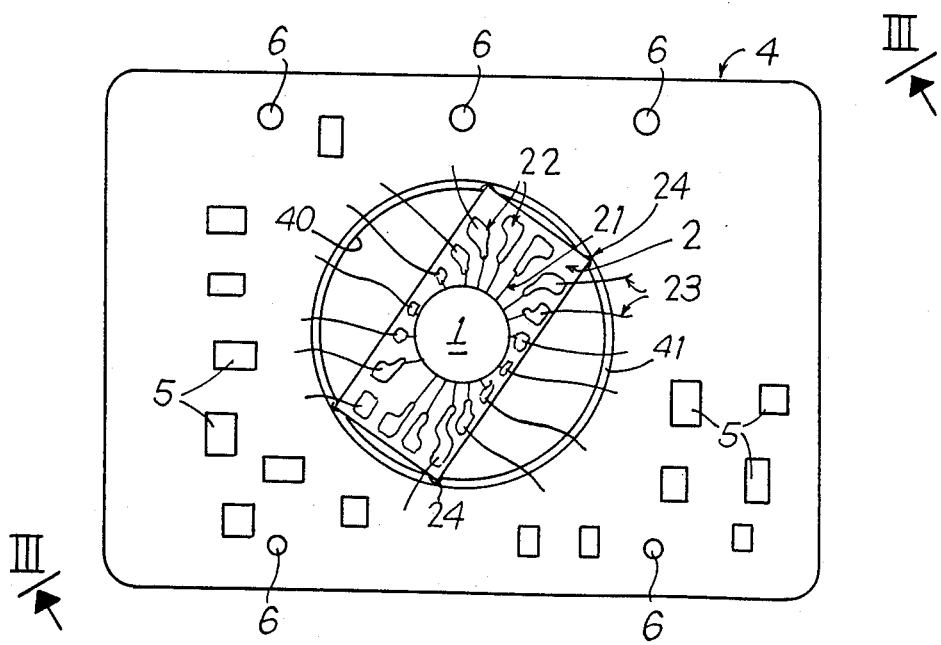
FIG. 2 is a plan view of an embodiment of an oscillator according to the invention comprising an assembly support on which is disposed an intermediate support such as the intermediate support of FIG. 1.
Figure 3:
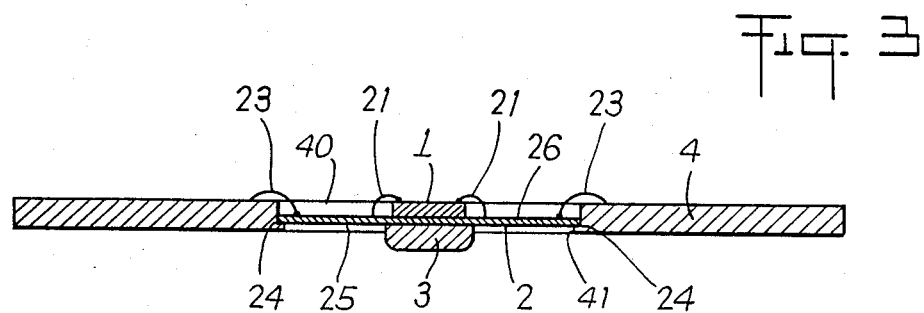
FIG. 3 is a view in section along line III—III of FIG. 2.

Referring now to the drawings, FIGS. 1 to 3 show the mechanical aspect of a miniature thermostatted oscillator made in accordance with a first embodiment of the invention.

The oscillator, which may in addition be disposed in a sealed package (not shown), in which a vacuum has been created, comprises a principal assembly support constituted by a printed circuit board 4 on which are disposed in conventional manner conducting metallic tracks (not shown) serving as connecting conductors for different discrete components 5 such as resistors or capacitors, mounted on board 4. Output terminals 6 of the oscillator are also formed in conventional manner on board 4.

An opening 40, for example circular, is made in the central part of the board 4 to allow the insertion of a secondary support 2 constituted by a wafer made of heat-conducting and electrically insulating material such as beryllium oxide. The wall of opening 40 defines an edge 41 in the form of a step on which rest the four corners 24 of the secondary wafer 2. Secondary wafer 2 may thus be fixed to the printed circuit board 4, for example by adhesion, at a small number of points, this limiting the thermal bridges between the insulating wafer 2 and the principal assembly support 4.

The beryllium oxide wafer 2 bears on one of its faces 26 an integrated circuit, or chip, advantageously constituted by a prediffused circuit 1. The prediffused circuit 1 is fixed to the center of wafer 2 with the aid of a layer of adhesive 11 ensuring a good thermal contact. A miniature piezo-electric resonator 3, for example a quartz resonator, is fixed on the opposite face 25 of the wafer 2, in the central part thereof, so as to be located as close as possible to the prediffused circuit 1. With such a sandwich structure, shown in FIG. 3, the temperature gradient between the resonator 3 and the prediffused circuit 1 may be much reduced.

A thick layer of gold may be deposited by screen process printing on face 26 of wafer 2 at localized zones 22 on the periphery of wafer 2 in order to form contact terminals connected to the prediffused circuit 1 by connecting wires 21. Capacitors 51 or other elements for adjusting the frequency of resonator 3 may also be disposed on wafer 2 between certain of terminals 22, or be placed directly on the package of resonator 3 fixed on face 25 of the BeO wafer 2.

Connecting wires 23 made of a good electrically conducting but poor heat-conducting material, connect the terminals 22 formed on wafer 2 to various conducting tracks of the printed circuit 2. The connecting wires 23 may be made for example of the material known under the name of tophet or made of stainless steel.

Figure 5:
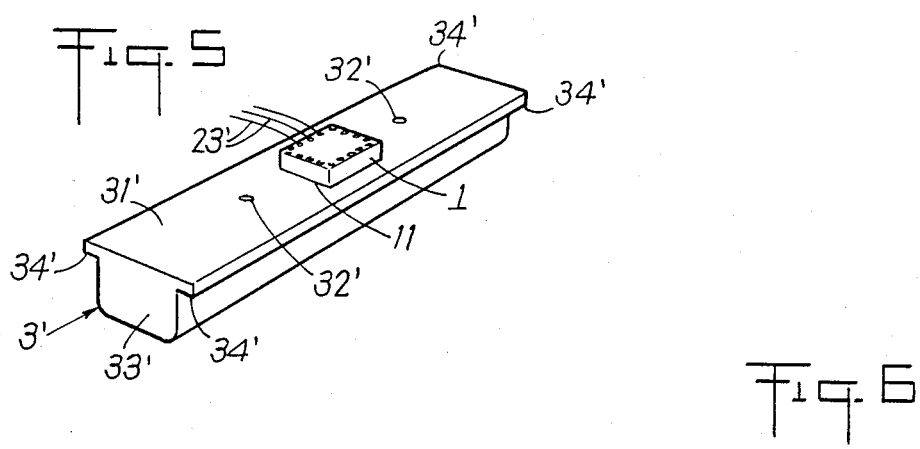
FIGS. 5 and 6 are views in perspective of two other types of intermediate supports constituted by resonator packages and capable of replacing the support of FIG. 2.
Figure 6:
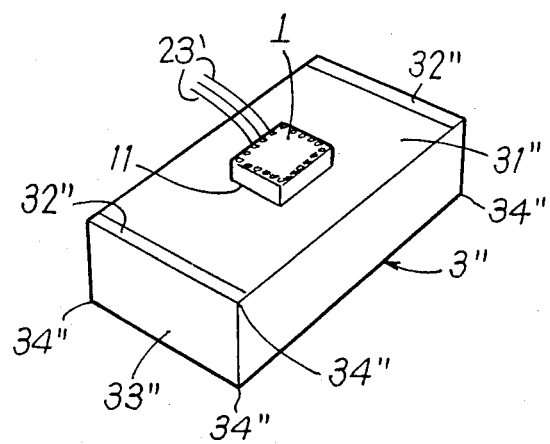

According to other possible embodiments shown in FIGS. 5 and 6, the secondary support adapted to be fixed at a limited number of points on the edge 41 of the opening 40 of the printed circuit board 4 may be constituted directly by the package 3', 3", respectively, of the resonator 3, this avoiding the use of an intermediate support such as the wafer 2 of the embodiment of FIGS. 1 to 3.

FIG. 5 shows a resonator 3 incorporated in a package 3' of bathtub type, which presents lateral end faces 33' in T-form and a plane face 31' corresponding to the horizontal arm of the T. Output terminals 32' are formed in face 31', but they may of course also be formed in the lateral faces 33'. The prediffused circuit 1 is directly fixed on the plane face 31' of the package 3', for example with the aid of a layer of adhesive 11 ensuring a good heat transfer. This embodiment allows an excellent heat exchange between the prediffused circuit 1 and the resonator 3 incorporated in package 3'. In fact, the thermostat integrated in the prediffused circuit 1 is in that case placed as close as possible to the resonator 3. The package 3' is adapted to rest on the edge 41 of the opening 40 of the board 4 by corners 34' of the plane face 31' constituting the horizontal arm of the T. Face 31' thus performs the same role as the wafer 2 of FIGS. 1 to 3, and the thermal energy exchanges between the package 3' and the printed circuit board 4 are reduced to a minimum since the package 3' is in contact only at four points with the board 4, and the package 3' may be fixed with an adhesive constituting a poor heat conductor.

FIG. 6 shows a variant embodiment in which the package 3" of resonator 3 is of the ceramic type and presents a parallelepipedic form with rectangular end faces 34" and a principal plane face 31" bearing along two of its opposite sides output terminals 32" of resonator 3 located inside package 3". The prediffused circuit 1 is fixed directly by adhesion on the plane face 31" of package 3", which leads to the same advantages as in the case of the embodiment of FIG. 5. Package 3" is adapted to rest on the edge 41 of the opening 40 of the printed circuit 4 by its corners 34" located on the principal plane face opposite face 31" bearing the prediffused circuit 1. As in the case of the assembly of FIG. 5, connecting wires 23', for example made of aluminium, directly connect the prediffused circuit 1 to the conducting tracks of the printed circuit 4.

By way of variant, the integrated circuit 1 may also be fixed inside the package of the resonator itself, either directly on the resonator, or on an inner face of the package of the resonator. In that case, the package of the resonator presents a plurality of output terminals allowing all the necessary links between the integrated circuit and the circuits outside the package constituted by the printed circuit 4. The sealed package is preferably provided so that a vacuum can be created thereinside.

An example of electronic circuits which may be used within the framework of the present invention will now be described with reference to FIG. 4.

The majority of the components figuring on the diagram of FIG. 4 are integrated within the prediffused circuit 1, this rendering the oscillator as a whole very compact and, in particular, as explained hereinbefore, enabling the circuit elements to be located as close as possible to resonator 3. In FIG. 4, the terminals of the circuit for supply of the device from an outside source of non-regulated voltage, for the taking of useful output signals, and the connection of the discrete components 5 of FIG. 2 located on the printed circuit 4 are designated by reference numbers 101 to 118. In order to facilitate the description, the components integrated within the prediffused circuit 1 bear 3-figure reference numbers of which the first figure is a 2, whilst the discrete components outside the pre-diffused circuit 1 and placed either on the printed circuit 4 or on the package of resonator 3, or on the beryllium oxide wafer 2, bear 3-figure reference numbers of which the first figure is a 3.

The assembly of the circuit shown in FIG. 4 may be divided into a plurality of functional sub-assemblies designated by references 201 to 205. For each of the functional sub-assemblies, a small number of elements only are constituted by discrete components which consume relatively little energy and correspond essentially to connecting, adjusting or negative feedback elements. Consequently, the major part of the energy dissipated in heat within the various functional sub-assemblies 201 to 205 is released within the prediffused circuit 1 which is placed in the immediate vicinity of resonator 3 and comprises in integrated form an internal thermostat 203. This contributes to improving the heat exchange yield with the resonator and to limiting the energy necessary for stabilizing the temperature of the resonator 3, this precisely allowing an assembly of electronic circuits to be produced which perform various functions including a function of thermostat within the same integrated circuit 1, and finally enabling a thermostatted oscillator of very small dimensions to be produced.

An important aspect of the present invention is therefore constituted by the combination within the same integrated circuit 1 of a plurality of functional sub-assemblies 201 to 205 comprising a first sub-assembly 201 constituting a regulator of the supply voltage of the assembly, a second two-stage sub-assembly 203, 205 comprising circuits 202 for maintaining the oscillations of resonator 3 and circuits 205 for amplifying the oscillations of stage 202, a third sub-assembly 203 constituting an internal thermostat and comprising in particular in integrated form a temperature sensor 270 to 273, a differential amplifier forming comparator 280 to 289, and heating transistors 276, 277 and, optionally, a fourth sub-assembly 204 comprising an integrated differential amplifier 240 to 249, similar to integrated differential amplifier 280 to 289, and intended to constitute a comparator for an external thermostat for rapid heating of the device comprising a temperature sensor and non-integrated heating means.

Each of the sub-assemblies 201 to 205 will now be described in greater detail.

The voltage regulator circuit 201 is entirely made within the prediffused integrated circuit 1 and receives a non-regulated D.C. supply voltage, for example of between 10 and 20 volts, on the general supply terminal 117 of the device, terminal 118 itself corresponding to the earthing terminal. The regulated D.C. output voltage of circuit 201, which is for example 7.3 V, is applied, via a resistor 220, on terminal 116 for supplying the steps 202 and 205 of the sub-assembly constituting the oscillator proper and, via a resistor 230, on terminal 110 for supplying the internal thermostat 203 and the differential amplifier 204 of the external thermostat. Bypass capacitors 320 and 330 constituted by discrete components are disposed between earth and terminals 116 and 110 respectively.

The voltage regulator circuit 201 comprises between terminals 117 and 118 a first branch which successively comprises two transistors 211, 212 connected as diodes and mounted in series and a resistor 213 connected between the emitter of the second transistor 212 and earth. A second branch successively comprises in series between the supply terminal 117 and earth a resistor 214, the emitter-collector space of a transistor 215, and two transistors 217, 216 connected as diodes mounted head to tail, and a transistor 219 mounted as a diode. The base of transistor 215 is connected to the point of connection between the emitter of transistor 212 and the resistor 213. The collector of transistor 215, connected to the emitter of transistor 217 connected as a diode, is connected to the base of the output transistor 218 of which the collector is connected to terminal 117 and the emitter is connected to terminals 116 and 110 via resistors 220 and 230, respectively.

The oscillator 202, 205 proper comprises a first stage 202 for maintaining the oscillations of resonator 3, which stage is constituted by components 221, 222a to 222e and 223 to 228 which are integrated in the prediffused circuit 1. Discrete components 321 to 324 further enable the frequency of the oscillator constituted by stage 202 to be adjusted. These frequency adjusting components comprise a tuning capacitor 324 and a variable capacity diode 321 mounted in series with the resonator 3 between the terminals 111 and 112, as well as two resistors 322, 323 connected between earth and the common points of connection respectively of the resonator 3 and the variable capacity diode 321 and of the variable capacity diode 321 and the tuning capacitor 324.

Within the first stage 202, terminal 111 is connected on the one hand to the emitter of a first transistor 224 whose collector is connected via a resistor 223 to the supply terminal 116, on the other hand to the collector of a second transistor 225 whose emitter is connected via a resistor 226 to earth. The terminal 112 is itself connected on the one hand to the emitter of a third transistor 227 whose base is connected to the collector of the first transistor 224 and collector is connected to the supply terminal 116, on the other hand to the collector of a fourth transistor 228 whose emitter is connected to earth and base is connected to the base of the second transistor 225 and to the collector of a transistor 222e mounted as a diode and presenting its emitter connected to earth. Four transistors 222a to 222d mounted as diodes are placed in series between the base of the first transistor 224 and the bases of the second and fourth transistors 225, 228. A resistor 221 connects the collector of transistor 222a mounted as a diode to the supply terminal 116.

It is thus seen that a small number of integrated components allows the maintenance of the oscillations of the resonator 3 whilst the frequency of the oscillations may easily be adjusted with the aid of the discrete components 321 and 324. The presence of the internal thermostat 203 within the prediffused circuit 1 itself and in the immediate vicinity of the resonator 3 guarantees an excellent stability of the oscillation frequency. The assembly shown in FIG. 4 is more particularly adapted to resonators whose frequency is less than about 15 MHz and whose resistance is less than about 100 ohms. For lower frequencies, higher resistors may, however, be admitted.

A coupling capacitor 325 constituted by a discrete component is connected between the output terminal 112 of the first stage 202 of the oscillator 202, 205 and the input terminal 113 of the amplifier stage 205. The amplifier stage 205 is itself conventional and comprises in integrated form in circuit 1 a first transistor 253 mounted as a common-collector of which the collector is connected to the supply terminal 116, the base is connected to the input terminal 113 and the emitter is connected by a resistor 254 to earth. The base of transistor 253 is connected by bias resistors 251, 252 respectively to terminal 116 and to earth. A second transistor 257 has its base connected to the emitter of the first transistor 253, its collector connected to the supply terminal 116 by two resistors 255, 256 mounted in series and its emitter connected to earth by two resistors 258, 259 mounted in series. An output transistor mounted as a common-collector has its collector connected to terminal 116, its emitter connected to output terminal 115 and by a resistor 260 to earth, and its base connected to the common point between the resistors 255, 256.

A bypass capacitor 326 constituted by a discrete component is further connected between earth and the terminal 114 located at the common point between resistors 258 and 259. A coupling capacitor 327 is furthermore connected to the output terminal 115 in order to allow direct connection to an assembly for processing or exploiting the output signal of the oscillator.

The internal thermostat 203 comprises elements essentially defining a temperature sensor, elements defining a reference voltage, a comparator and heating transistors. Except for an adjusting resistor 335, if necessary for an adjusting resistor 334 mounted in parallel on a resistor 334a inside the integrated circuit, and for a negative feedback circuit 331 to 333, all the elements of the temperature regulating circuit 203 are integrated in circuit 1.

A first branch connected between the supply terminal 110 and earth comprises a resistor 231 mounted in series with a transistor 232 connected as a diode. This branch 231, 232 defines a current which, at the start, is absorbed by transistor 233 of which the base is connected to the collector of transistor 232, emitter is connected to the emitters of four transistors 270a to 270d mounted in parallel and collector is connected to the bases of transistors 235, 237, 280, 286, 240, 246. Transistor 233 thus defines a current mirror circuit which allows the circulation of an identical current respectively comprising the group 270 of transistors 270a to 270d in parallel, and transistor 271, and supplied respectively by current sources 234, 235 and 236, 237. The current source 234, 235 comprises a transistor 235 whose base is connected to the collector of transistor 233, collector is connected to the collectors of transistors 270a to 270d and emitter is connected by resistor 234 to the supply terminal 110. Similarly, the current source 236, 237 comprises a transistor 237 whose base is connected to the collector of transistor 233, collector is connected to the collector of transistor 271 and emitter is connected by resistor 236 to terminal 110. The transistor 238, whose emitter is connected to the collector of transistor 233, collector is connected to earth and base is connected to the collector of transistor 235 is provided to improve the symmetry of the currents.

A resistor 272 is connected between the emitters of transistors 270a to 270d and the emitter of transistor 271 itself connected to earth by a resistor 273. The common point between the resistors 272 and 273 is connected to a terminal 101 on which is available a voltage proportional to the internal temperature of the integrated circuit 1 defined from the integrated temperature sensor essentially constituted by the group of transistors 270. In fact, the surface of the emitters is in a ratio of four to one between the branch comprising the group 270 of four transistors in parallel and the branch comprising one single transistor 271. Insofar as the current sources 234, 235 and 236, 237 deliver identical currents, the saturation currents in group 270 of four transistors and in transistor 271 will be in a ratio of four to one taking into account the ratio of the surfaces of emitters. It follows that a potential difference appears at the terminals of resistor 272 and on terminal 101 there exists a voltage depending on the resistors 272 and 273 and which varies proportionally to the temperature. By way of example, the sensitivity of the temperature sensor 270 to 273 may be 2 mV per degree Celsius.

A terminal 102 receives a reference voltage insensitive to the temperature or to the residual fluctuations of the supply voltage. Terminal 102 is connected by a resistor 274 to the emitter of an assembly 239 of two transistors mounted in Darlington, of which the collector is connected to the supply terminal 110 and base is connected to the collector of the transistor 237. An assembly of two resistors 275, 335 mounted in series is further connected between terminal 102 and earth. The common point between resistors 275 and 335 is constituted by a terminal 103 which makes it possible to use a resistor 335 in the form of a discrete component, this making it possible to adjust the reference voltage on terminal 102, and therefore the reference temperature of the thermostat. At equilibrium, the voltages on terminals 101 and 102 are equal or very close. The difference between the voltages on terminals 101 and 102 serves to control the heating made by the assembly in parallel of two power transistors 276, 277 fed with current and integrated in circuit 1.

Terminals 101 and 102 are connected to the inverter and non-inverter inputs of a conventional integrated differential amplifier 280 to 289, which serves as comparator for delivering at the output on the bases of the power transistors 276, 277 a heating control signal when there is inequality between the voltages present on terminals 101 and 102.

The differential amplifier 280 to 289 comprises a source of current constituted by transistor 280 of which the base is connected to the collector of transistor 233, emitter is connected by a resistor 285 to the supply terminal 110 and collector is connected to the emitters of transistors 281, 282 of which the bases are connected to terminals 101 and 102 respectively and collectors are connected to the collectors of transistors 283, 284 of which the emitters are connected to earth and the bases are connected together. The collector of transistor 283 is connected to its base whilst the collector of transistor 284, on which appears the differential output signal, is connected to the base of a transistor 287 of which the emitter is connected to earth and collector is connected to the collector of transistor 286 whose emitter is connected to terminal 104 allowing the connection between terminals 110 and 104 of a resistor 334 for limiting current in the power transistors 276, 277. The bases of the power transistors 276, 277 are in fact connected by a resistor 289 to the emitter of a transistor 288 of which the base is connected to the collector of transistor 286 and collector is connected to terminal 110. The bases of transistors 276, 277 are connected to a terminal 105 on which is available the heating control signal. A negative feedback circuit composed of discrete elements is in addition connected between terminals 101 and 105. This circuit comprises a resistor 332 and two capacitors 331 and 333. These latter are connected between earth and terminals 105 and 101 respectively.

Sub-assembly 204 constitutes an additional circuit allowing, when the oscillator is switched on, a rapid heating thereof. Sub-assembly 204 comprises terminals 106, 107, 108, 109 of which the roles are similar respectively to those of terminals 101, 102 ,104, 105 of the internal thermostat 203. Components 240 to 249 of the differential amplifier of circuit 204 are also similar to the corresponding elements 280 to 289 of the differential amplifier of the internal thermostat 203 and are also integrated on the same prediffused circuit 1. The current limitation resistor 344 performs the same role as the limitation resistor 334 and is also constituted by a discrete component and the elements 341 to 343 of the negative feedback circuit connected between terminals 109 and 106 present the same structure as the elements 331 to 333 of the negative feedback circuit connected between terminals 105 and 101.

Terminal 106 allows the connection of a temperature sensor outside the prediffused circuit 1, which sensor may comprise for example a thermistor. Terminal 107 allows the connection of components defining a voltage reference and performing the role of elements 233, 274, 275, 235 of the internal thermostat 203. Finally, terminal 109 allows the connection of heating resistors or transistors outside the integrated circuit 1 and performing the role of transistors 276, 277 of the thermostat 203.

The thermostatted oscillator according to the invention, as shown in FIG. 2 and with all the elements of the electronic circuits of FIG. 4, may present a very small total volume. By way of example, an oscillator according to the invention has been made with a beryllium oxide wafer 2 about 6 mm wide and about 12 mm long, placed in the opening 40 of a printed circuit 4 whose dimensions are about 3 cm×2 cm. The connecting wires 23 are themselves constituted by tophet wires presenting a diameter of 50 microns. In the case of an oscillator according to the embodiments of FIGS. 5 and 6, the connecting wires 23' may be made of aluminium and may present a diameter of 25 microns.

What is claimed is:

1. In a miniature thermostatted oscillator, comprising:
an assembly support including a printed circuit board provided with an opening therein having an edge;
a secondary support made of an electrically insulating material having first and second principal faces mounted within said board opening at a reduced number of points in the vicinity of said edge;
a piezo-electric resonator mounted on said first principal face;
an integrated circuit including an electronic circuit for regulating the supply voltage of said piezo-electric resonator, an electronic circuit for maintaining and amplifying the oscillations of said resonator, and electronic circuit means for regulating the temperature of said resonator, all mounted as parts within said integrated circuit which, in turn, is mounted on said second principal face.

2. The oscillator of claim 1, additionally comprising said secondary support constituted by a wafer made of an electrically insulating and heat-conducting material, which bears on its first principal face said piezo-electric resonator and on its second principal face said integrated circuit and which rests at a small number of points on the edge of the opening in said printed circuit board.

3. The oscillator of claim 2, wherein said secondary support is constituted by a wafer of beryllium oxide.

4. The oscillator of claim 2, wherein said integrated circuit and the package of the resonator are located opposite each other on either side of the secondary support wafer and are fixed thereon with the aid of an adhesive ensuring good thermal contact.

5. The oscillator of claim 2, additionally comprising said secondary support wafer having mounted on the face bearing said integrated circuit parts a plurality of metallized contact terminals; first and second connecting wires; said contact terminals connected, on the one hand, to the integrated circuit by said first connecting wires and, on the other hand, to the printed circuit board by said second connecting wires, said second connecting wire made of a poor heat-conducting material.

6. The oscillator of claim 1, additionally comprising said secondary support formed directly by a package which encloses and mounts said piezo-electric resonator; said integrated circuit fixed to said package; and said package resting at a small number of points on the edge of the opening made in the printed circuit board.

7. The oscillator of claim 6, wherein said package comprises a sealed package provided with a plurality of output terminals which are electrically connected to said printed circuit board.

8. The oscillator of claim 1, further comprising means for controlling the frequency of the oscillator including discrete components mounted upon said secondary support.

9. The oscillator of claim 1, wherein said electronic circuit means for regulating the temperature of the resonator comprise an internal thermostat comprising a temperature sensor, a comparator circuit, and heating transistors integrated into said integrated circuit.

10. The oscillator of claim 9, wherein said internal thermostat further comprises a resistor for adjusting the internal reference temperature and a resistor for adjusting the current in the heating transistors, which are constituted by discrete components placed on the printed circuit board.

11. The oscillator of claim 9 wherein said internal thermostat further comprises a negative feedback circuit constituted by discrete components placed on the printed circuit board.

12. The oscillator of claim 1, wherein said electronic circuit means for regulating the temperature of the resonator further comprise a differential amplifier forming a comparator integrated into said integrated circuit, a temperature sensor and a heating transistors formed by discrete components placed on said printed circuit board to form an external thermostat for rapidly heating the oscillator.

13. The oscillator of claim 1, additionally comprising a sealed package provided with output terminals inside which is placed said assembly support including said printed circuit board and said secondary support.

* * * * *